United States Patent
Chang et al.

(10) Patent No.: US 10,666,255 B1
(45) Date of Patent: May 26, 2020

(54) SYSTEM AND METHOD FOR COMPACTING X-PESSIMISM FIXES FOR GATE-LEVEL LOGIC SIMULATION

(71) Applicant: Avery Design Systems, Inc., Tewksbury, MA (US)

(72) Inventors: Kai-Hui Chang, North Andover, MA (US); Hong-zu Chou, Taipei (TW)

(73) Assignee: Avery Design Systems, Inc., Tewksbury, MA (US)

( * ) Notice: Subject to any disclaimer, the term of this patent is extended or adjusted under 35 U.S.C. 154(b) by 0 days.

(21) Appl. No.: 15/798,247

(22) Filed: Oct. 30, 2017

Related U.S. Application Data

(60) Provisional application No. 62/424,628, filed on Nov. 21, 2016.

(51) Int. Cl.
*G06F 17/50* (2006.01)
*H03K 19/003* (2006.01)
*H03K 19/173* (2006.01)
*G06F 30/33* (2020.01)

(52) U.S. Cl.
CPC ....... *H03K 19/003* (2013.01); *H03K 19/1737* (2013.01); *G06F 30/33* (2020.01)

(58) Field of Classification Search
CPC ............... G06F 17/5027; G06F 17/505; G06F 17/5045; G06F 17/5022; G06F 15/7867; G06F 17/504; G06F 2217/62; G06F 2217/06; G06F 2217/64; G06F 11/263; G06F 11/267; G06F 17/5077; G06F 2217/14; G06F 2217/84
USPC ........ 716/100–107, 111–112, 114, 122, 132, 716/136; 703/13–14
See application file for complete search history.

(56) References Cited

U.S. PATENT DOCUMENTS

| | | |
|---|---|---|
| 2008/0092093 A1* | 4/2008 | Balakrishnan ............................. G01R 31/318328 716/103 |
| 2017/0212968 A1* | 7/2017 | Diao ........................ G06F 30/33 |

OTHER PUBLICATIONS

Smith et al., Design Diagnosis Using Boolean Satisfiability, IEEE, 2004, pp. 218-223 (Year: 2004).*

* cited by examiner

*Primary Examiner* — Nghia M Doan
(74) *Attorney, Agent, or Firm* — Loginov & Associates, PLLC; William A. Loginov

(57) ABSTRACT

A computer executable tool analyzes Boolean logic in a gate-level netlist responsible for generating false Xs due to X-pessimism in logic simulation to produce a compact fix that corrects the X-pessimism problem. The fix restores logic simulation value from X to hardware-accurate non-X value and solves X-pessimism issues in logic simulation.

10 Claims, 3 Drawing Sheets

```
always @(g1.o or g2.o or reg1.q)
if (g1.o === 1'b1 && g2.o === 1'b1 && reg1.q === 1'bx)
    force g6.o = 1'b0;
else
    release g6.o;
```

SYSTEM AND METHOD FOR COMPACTING X-PESSIMISM FIXES FOR GATE-LEVEL LOGIC SIMULATION

RELATED APPLICATIONS

This application claims the benefit of U.S. Provisional Application Ser. No. 62/424,628, filed Nov. 21, 2016, entitled SYSTEM AND METHOD FOR COMPACTING X-PESSIMISM FIXES FOR GATE-LEVEL LOGIC SIMULATION, the entire disclosure of which is herein incorporated by reference.

FIELD OF THE INVENTION

The invention relates generally to integrated circuit design and, most particularly, to techniques for correcting gate-level logic simulation when unknowns (Xs) exist.

BACKGROUND OF THE INVENTION

In the prior art, inventors' prior art, "System and Method for Correcting Gate-level Simulation Accuracy when Unknowns Exist," U.S. Pat. No. 8,402,405, a method for identifying false Xs and generating fixes was disclosed, and a methodology to correct gate-level simulation was proposed.

In the prior art, the system and method to identify false Xs work as follows. The input to the method is a register data input, d, that has X in logic simulation. The method returns true if the X is false; otherwise, false is returned. The fan-in cone circuit is also returned in subckt. This is achieved using the following steps.

(1) Trace the fan-in cone of d along the variables whose logic simulation values are Xs. Add all the gates along the trace to subckt. Stop when the variable is a primary input of the design or an output of a register.

(2) Build a Boolean function from subckt. The output of the function is d, and the inputs are the primary inputs of subckt. For each input, check its logic simulation value. If the value is not X, propagate the non-X value through the input to simplify the Boolean function. If the value is X, the input remains an input of the simplified Boolean function.

(3) Use a Boolean solver to check whether the output is constant. If so, return true. Otherwise, return false. subckt is also returned.

After false X is identified, our prior art minimizes X-eliminating sub-circuit to generate compact fixes to eliminate the false X. The input to the method is subckt, and the output is a new subckt that is a subset of the original one and still eliminates false Xs. The first minimization is called function ckt_minimize1 in our prior art and works as follows.

(1) Move the output of subckt to one of the inputs of its fan-in gate that has X in logic simulation. A new sub-circuit, subcktn, will be formed.

(2) Use the false-X identification algorithm described earlier to prove whether subckt$_n$ produces a false X and its output is still a constant. If it is no longer a constant, discard the change. Otherwise, replace subckt with subckt$_n$. Repeat step (1) and (2) until no further changes can be made.

At this point, the primary output of subckt, called cpo, is a variable whose X is false that is farthest from the output of the original subckt. Function ckt_minimize2 in our prior art then performs the following steps that reduces subckt from its inputs. Note that we use terminology fanin frontier to represent a collection of wires in the netlist that form a cut while the logic on the fanout side of the cut still generates a false X.

(1) Remove each gate that connects to the primary inputs of subckt, one at a time, to form a new sub-circuit called subckt$_n$. The output of the gate becomes a potential new fanin frontier variable.

(2) Check if cpo is still constant using subcktn. If it is no longer constant, discard the change. Otherwise, replace subckt with subckt$_n$. Repeat step (1) and (2) until no further changes can be made.

At this point, subckt is a subset of the original subckt whose inputs are real Xs and whose output is a false X. Since removing any single gate will produce a real X again, this sub-circuit is a minimal one that can eliminate the X.

The sub-circuit (subckt) produced in the above method can be used to generate auxiliary-code to repair gate-level logic simulation, and the steps to do so are as follows.

(1) Traverse the inputs (fanin frontier) of subckt to generate the condition for the false X to occur based on its logic simulation value. For example, if variable var1 is 1 and var2 is X in logic simulation, the condition is "var1===1'b1 && var2===1'bx".

(2) Generate code to replace the X with the known constant value when the condition matches. The constant value can be derived by assigning random non-X values to the inputs of subckt and checking its output. When the condition does not match, the generated code should disable such value over-write. In the Verilog and SystemVerilog Hardware Design Language, "force" and "release" commands can be used.

An example to repair the X-pessimism problem in the netlist shown in FIG. 1 is shown in FIG. 2. The generated code can fix all false Xs that match the condition.

Function ckt_minimize2 described in our prior art is based on a trial-and-error heuristic that iteratively removes each gate and then uses formal analysis to prove if the remaining subckt still generates a false X. While effective in producing highly optimized fixes, it is time-consuming and may not scale well to complicated logic with a large number of gates. This is especially problematic for arithmetic logic or design for testability constructs like observability or controllability points whose logic can be much more complicated than ordinary logic. In this invention we propose a new method to address this issue.

SUMMARY OF THE INVENTION

The present disclosure overcomes disadvantages of the prior art method that minimizes false-X generating logic from fanin to fanout for more compact fixes. This is achieved by inserting multiplexers (MUXes) to model each possible final fanin frontier location and then converting the modified logic into Conjunctive Normal Form (CNF). The CNF is then constrained to the opposite value of the circuit output and a satisfiability (SAT) solver is used to solve the CNF. Since the CNF is unsatisfiable, an unsatisfiable core will be returned by the solver and is analyzed. Locations responsible for the unsatisfiable condition (i.e. producing the false X) will be part of the conflict core and can be identified. The rest of the locations can all potentially be in the fanin frontier and a circuit traversal is performed to identify the optimized final fanin frontier for generating compact fixes.

The proposed new method uses unsatisfiable core returned by modern SAT solvers for its analysis. Given an unsatisfiable SAT instance represented in CNF, an unsatisfiable core of the original SAT instance is a subset of clauses whose conjunction is still unsatisfiable. Modern SAT solvers can produce a resolution graph which proves the unsatisfiability of the original problem, and this can be further analyzed to produce a smaller unsatisfiable core. A minimum unsatisfiable core contains the smallest number of the original clauses required to still be unsatisfiable. Modern SAT solvers can typically produce highly compact unsatisfiable cores that are much smaller than the original SAT instances. However, the returned unsatisfiable cores may not be the absolute minimum ones. For example, a SAT instance "(A) AND (–A) AND (B) AND (–B) AND (C OR D)" is unsatisfiable because the Boolean formula can never be 1 no matter what value literals A and B have. Since either "(A) AND (–A)" or "(B) AND (–B)" are enough to make the SAT instance unsatisfiable, either one is an unsatisfiable core of the SAT instance.

Modern SAT solvers can consider assumptions when solving a SAT instance. An assumption is a value assigned to a literal and SAT solvers must use the assigned value to solve the SAT instance. Take SAT instance "(A OR –B) AND (A OR B)" for example, the problem is satisfiable if A is 1. If we make the assumption that A is 0, then the problem becomes unsatisfiable because when A is 0, the problem becomes "(–B AND B)", which can never be 1 no matter what value literal B has. Modern SAT solvers can return all literals in the unsatisfiable core that have assumed values: those assumptions caused the SAT instance to be unsatisfiable. And we utilize this feature in our proposed method.

BRIEF DESCRIPTION OF THE DRAWINGS

For a more complete understanding of the invention, reference should be made to the following detailed description and accompanying drawing figures, in which like reference numerals identify like elements in the figures, and in which.

DETAILED DESCRIPTION

An advantage of the present disclosure is to more efficiently minimize sub-circuit responsible for generating a false X by moving fanin frontier toward circuit output. The following steps achieve this goal.

(1) Insert a MUX at each location where the optimized fanin frontier could be. This is typically the output wire of every gate but the selection can be based on some heuristics such as not adding MUXes to wires between gates in a chain of buffers or inverters. The MUX select line is a new primary input to the circuit. The output of the MUX connects to the original fanout of the gate. When select is 0, the input comes from the original output of the gate. When select is 1, the input comes from a new primary input to the circuit.

(2) The circuit is converted to a CNF. The output of the circuit is constrained to be the opposite value of the original output to make sure the CNF is unsatisfiable. CNF conversion can be achieved by creating a literal for each wire and converting logic gates into corresponding CNF terms. For example, an AND gate "C=A AND B" can be converted to "(–A OR –B OR C) AND (A OR –C) AND (B OR –C)". "Tseytin Transformation" is a commonly used method for converting combinational logic into CNFs.

(3) The CNF is fed to a SAT solver for solving with the assumption that all select lines are 0. The problem is unsatisfiable under the assumption and modern SAT solvers, such as MiniSAT, can return a unsatisfiable core containing variables (select lines in this case) in the assumption that are responsible for the unsatisfiability. All MUXes with select lines in the unsatisfiable core are responsible for making the CNF unsatisfiable, and their corresponding wires must not be in the final frontier. This is because making any of them a primary input to the sub-circuit will make the problem satisfiable, meaning that the output of the circuit can have 0/1 values and is no longer a false X.

(4) Obtain the optimized fanin frontier by collecting wires that are closest to the output whose select lines of corresponding MUXes are not in the unsatisfiable core. One possible implementation is to add all wires whose MUX select lines are not in the unsatisfiable core into a hash table and do a depth-first traversal from the circuit output. Traversal returns to the previous level whenever a wire in the hash table is encountered and the wire is added to the optimized final fanin frontier. Once the traversal is done the optimized final fanin frontier is obtained.

Figures 1, 2:
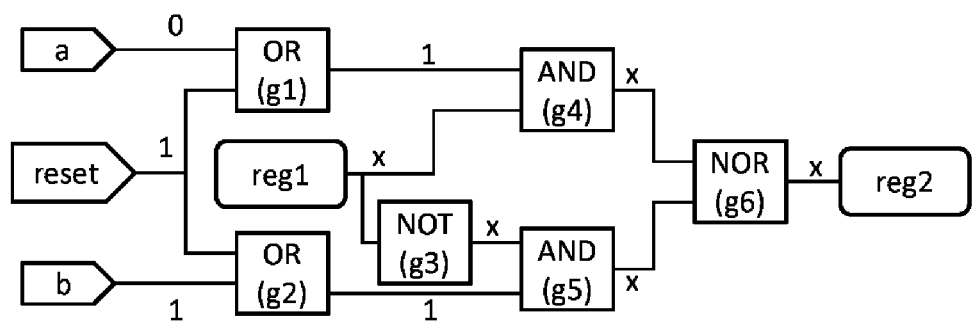
FIG. 1 illustrates an example of X-pessimism. The output of g6 should be 0 but logic simulation incorrectly produces X.
FIG. 2 presents example code generated by this invention to fix the X-pessimism problem in FIG. 1. The output port of a combinational gate is named "o", and the output of a register is named "q".
Figure 3:
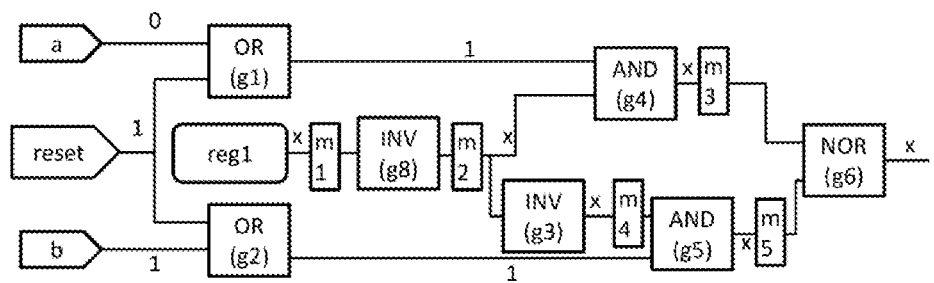
FIG. 3 presents example netlist with MUXes inserted for fanin frontier minimization.
Figure 4:
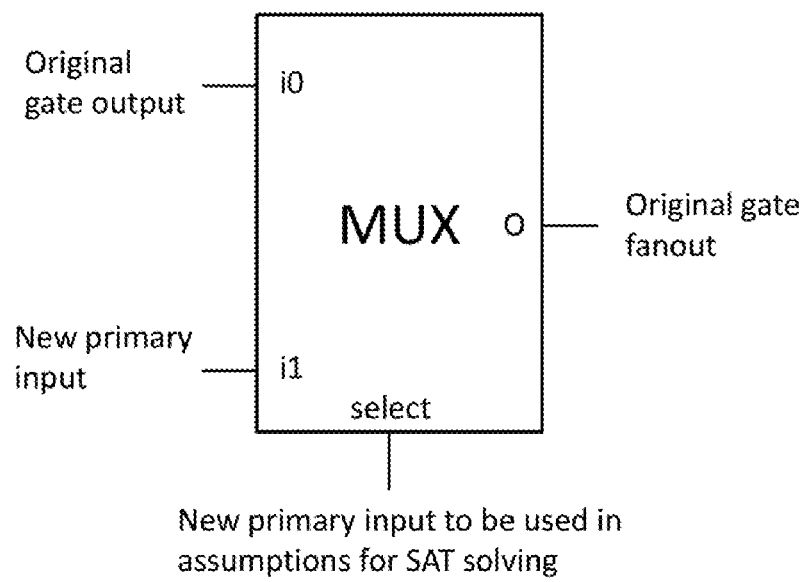
FIG. 4 provides details on the MUX inserted in FIG. 3. Input when select=0 comes from the gate output, input when select=1 is a new primary input, select is a new primary input, and MUX output drives the original fanout of the gate.

An example is provided in the netlist shown in FIG. 3. By way of background, a netlist is a description of the connectivity of an electronic circuit and can be in various forms, such as physical or logical, instance-based or net-based, and flat or hierarchical. In one example, the netlist can be data stored in a memory, such as the memories 114 or 124 shown in FIG. 5. In the example, MUXes (named m1 to m5) are inserted to the outputs of gates whose outputs are Xs. The details of the MUXes are shown in FIG. 4. The MUXes are used to determine if the wire can be replaced with a new primary input (thus moving fanin frontier there) or has to be driven by the original gate. In this example, the select lines of m1 and m2 can be set to 1 and the output of g6 will still be 0. But if any of the remaining three MUXes have its select line set to 1, the output of g6 will become a real X.

Continuing with the example, the present system and method first converts the netlist of FIG. 3 into a CNF add then collects the select lines and make them assumptions for the SAT solver. In the example, assume we use literal sN to represent the select line of mN, we will have five literals, s1 to s5, that are assumed to be 0 in the assumption. We then constrain the output of g6 to 1 and use a SAT solver to solve the problem. Since the output of g6 has to be 0, the problem must be unsatisfiable, and the solver's conflict core analysis will determine that s3, s4 and s5 contribute to the unsatisfiability of the problem and will be returned as literals causing conflict. We can then add wires corresponding to the MUXes that are not involved in the returned conflict literals as optimized fanin frontier. From the example, we can see that all MUXes not responsible for the conflict, including m1 and m2, are both included and not just the one closest to the output g6. Therefore, a traversal from output of the circuit to collect the final fanin frontier is needed. The final optimized frontier will then be g8.o==X, g1.o ==1 and g2.o==1.

Modern SAT solvers try to reduce the sizes of unsatisfiable cores but may not always produce the minimal ones. An iterative approach that solves the problem again using the optimized fanin frontier can be applied for potentially better results.

Although CNF and SAT solvers are described in the present application, any form of logic representation and Boolean manipulation that serve the same purpose, such as Disjunctive Normal Form (DNF) and Pseudo-Boolean solvers, can be used without departing from the essence of methods presented in this invention. The use of CNF and SAT solver is an example implementation of the presented invention but does not limit this invention to these implementations.

Figure 5:
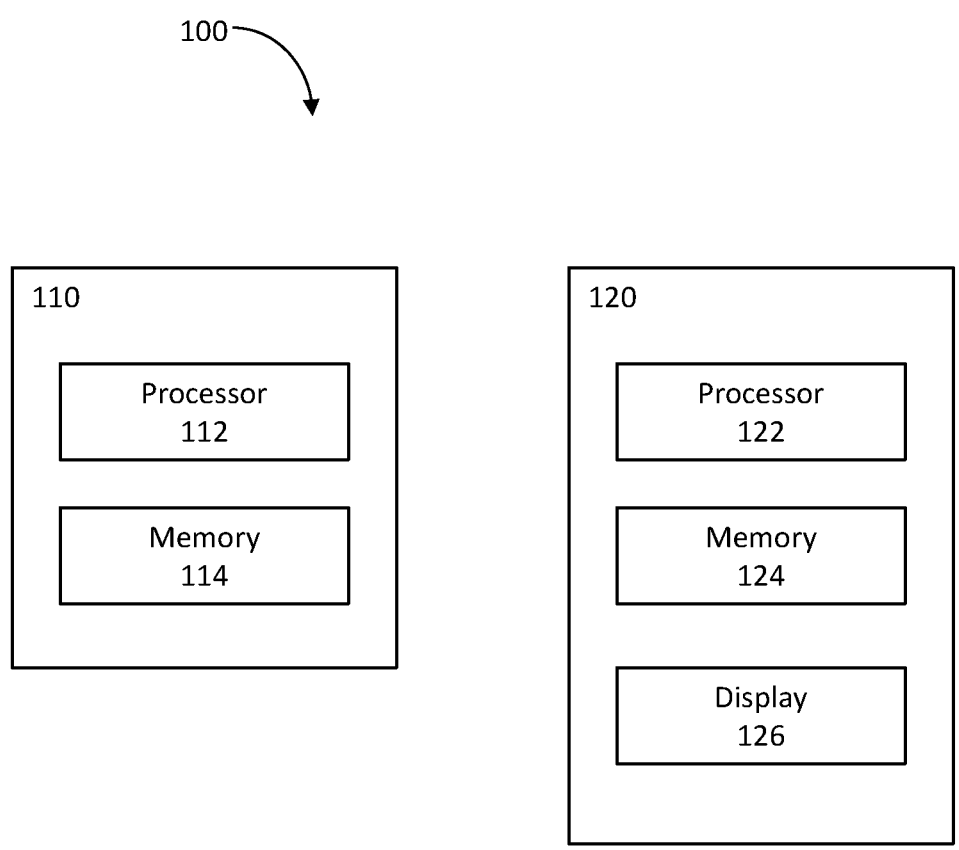
FIG. 5 is a block diagram of a system 100 according to aspects of the disclosure. As shown, the system 100 may include a computing device 110 and a client computing device 120.

FIG. 5 is a block diagram of a system 100 according to aspects of the disclosure. As shown, the system 100 may include a computing device 110 and a client computing device 120.

The computing device 110 may include at least one processor 112, at least one memory 114, and any other components typically present in general purpose computers. The memory 114 may store information accessible by the processor 112, such as instructions that may be executed by the processor or data that may be retrieved, manipulated, or stored by the processor. The memory 114 and/or processor 112 can be programmed to carry out a set of logical or arithmetic operations. In one example, the logical or arithmetic operations may be stored on a non-transitory computer readable medium. The processor obtains information from memories, performs logical or arithmetic operations based on programmed instructions, and stores the results of the operations into memories. Although FIG. 5 illustrates processor 112 and memory 114 as being within the same block, it is understood that the processor 112 and memory 114 may respectively comprise one or more processors and/or memories that may or may not be stored in the same physical housing. In one example, computer 110 may be a server that communicates with one or more client devices 120, directly or indirectly, via a network (not shown). The computing device 110 can interact with users through input and output devices (not shown), such as keyboards, mouses, disks, networks, displays and printers.

The client computing device 120 may be configured similarly to the computer 110, such that it may include processor 122, a memory 124, and any other components typically present in a general purpose computer. The client device 120 may be any type of computing device, such as a personal computer, tablet, mobile phone, laptop, PDA, etc. In this example, the client device 120 may also include a display 126, such as an LCD, plasma, touch screen, or the like.

The computer executable processing component described in the present disclosure can be executed by the processor(s) of one or more computing devices, such as computing device 110 and/or client computing device 120, or any other computing device.

The foregoing has been a detailed description of illustrative embodiments of the invention. Various modifications and additions can be made without departing from the spirit and scope of this invention. Features of each of the various embodiments described above can be combined with features of other described embodiments as appropriate in order to provide a multiplicity of feature combinations in associated new embodiments. Furthermore, while the foregoing describes a number of separate embodiments of the apparatus and method of the present invention, what has been described herein is merely illustrative of the application of the principles of the present invention. For example, while one X-pessimism example is shown for illustrative purpose, any design netlist can be employed in accordance with the teachings herein. Additionally, while particular exemplary code is shown and described for illustrative purposes, the auxiliary code generated in accordance with embodiments herein is highly variable within ordinary skill to achieve correction and accuracy improvement described hereinabove for gate-level simulation. Moreover, while particular arrangements of applications, computers, simulators, and other simulation environment elements are shown, the arrangements are highly variable and can be all disposed within a single server or computing device, or the applications can be spread over a variety of servers as appropriate and within ordinary skill. Moreover, a depicted process or processor can be combined with other processes and/or processors or divided into various sub-processes or processors. Such sub-processes and/or sub-processors can be variously combined according to embodiments herein. Likewise, it is expressly contemplated that any function, process and/or processor herein can be implemented using electronic hardware, software consisting of a non-transitory computer-readable medium of program instructions, or a combination of hardware and software. Accordingly, this description is meant to be taken only by way of example, and not to otherwise limit the scope of this invention.

What is claimed is:

1. A method of generating minimized false-X fixes in a netlist, comprising:
   inserting at least one multiplexer (MUX) at at least one output wire of a gate;
   converting the netlist, including the inserted MUX, into a conjunctive normal form (CNF) netlist;
   constraining an output exhibiting a false-X of the CNF netlist to an opposite value of the false-X, wherein the CNF must be unsatisfiable;
   identifying a compact unsatisfiable core to reduce X-pessimism fix complexity;
   traversing the netlist; and
   collecting fanin frontier variables closest to the output of the netlist for each MUX select line that is not in the unsatisfiable core.

2. The method of claim 1, wherein inserting at least one multiplexer (MUX) at at least one output wire of a gate comprises inserting at least one MUX at each output wire of every gate.

3. The method of claim 1, further comprising assuming each select line is 0 and solving the CNF netlist.

4. The method of claim 1, further comprising adding all wires with MUX select lines not in the unsatisfiable core into a hash table.

5. The method of claim 1, wherein:
   if a MUX select line is 0 a MUX input comes from an original output wire,
   if the MUX select line is 1 the MUX input comes from a new primary input.

6. A system for generating minimized false-X fixes in a netlist, the system comprising:
   a processor; and
   a memory having executable instructions stored there on such that, when executed by the processor, result in the processor being configured to:
   insert at least one multiplexer (MUX) at at least one output wire of a gate;
   convert the netlist, including the inserted MUX, into a conjunctive normal form (CNF) netlist;

constrain an output exhibiting a false-X of the CNF netlist to an opposite value of the false-X, wherein the CNF must be unsatisfiable;

identify a compact unsatisfiable core to reduce X-pessimism fix complexity;

traverse the netlist; and collect fanin frontier variables closest to the output of the netlist for each MUX select line that is not in the unsatisfiable core.

7. The system of claim 6, wherein inserting at least one multiplexer (MUX) comprises inserting at least one MUX at each output wire of every gate.

8. The system of claim 6, further comprising assuming each select line is 0 and solving the CNF netlist.

9. The system of claim 6, further comprising adding all wires with MUX select lines not in the unsatisfiable core into a hash table.

10. The system of claim 6, wherein:

if a MUX select line is 0 a MUX input comes from an original output wire, if the MUX select line is 1 the MUX input comes from a new primary input.

\* \* \* \* \*